United States Patent
Ito et al.

(10) Patent No.: US 7,412,671 B2
(45) Date of Patent: Aug. 12, 2008

(54) APPARATUS AND METHOD FOR VERIFYING AN INTEGRATED CIRCUIT PATTERN

(75) Inventors: Takeshi Ito, Yokohama (JP); Takahiro Ikeda, Yokohama (JP); Koji Hashimoto, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/948,540

(22) Filed: Sep. 24, 2004

(65) Prior Publication Data
US 2005/0086618 A1    Apr. 21, 2005

(30) Foreign Application Priority Data
Sep. 25, 2003    (JP) ............... 2003-334106

(51) Int. Cl.
*G06F 17/50*    (2006.01)
(52) U.S. Cl. ............... 716/4; 716/10; 716/21
(58) Field of Classification Search ............... 356/237.5; 716/5, 4, 10, 21
See application file for complete search history.

(56) References Cited

U.S. PATENT DOCUMENTS

| | | | | |
|---|---|---|---|---|
| 5,365,600 | A * | 11/1994 | Nagaishi | 382/281 |
| 6,038,020 | A | 3/2000 | Tsukuda | 356/237.5 |
| 6,058,252 | A * | 5/2000 | Noll et al. | 716/10 |
| 6,106,567 | A * | 8/2000 | Grobman et al. | 716/5 |
| 6,560,768 | B2 | 5/2003 | Inanami et al. | 716/21 |
| 6,578,184 | B2 | 6/2003 | Fukuda et al. | 716/13 |
| 6,647,147 | B1 * | 11/2003 | Miyano | 382/199 |
| 6,865,726 | B1 * | 3/2005 | Igusa et al. | 716/18 |
| 6,948,145 | B2 * | 9/2005 | Brown et al. | 716/12 |
| 6,968,527 | B2 * | 11/2005 | Pierrat | 716/19 |
| 2003/0074156 | A1 | 4/2003 | Ikeda et al. | |
| 2003/0084416 | A1 * | 5/2003 | Dai et al. | 716/7 |
| 2003/0154461 | A1 * | 8/2003 | Pierrat | 716/21 |
| 2004/0096092 | A1 | 5/2004 | Ikeda | |

(Continued)

FOREIGN PATENT DOCUMENTS

JP    62-249037    10/1987

(Continued)

OTHER PUBLICATIONS

Hashimoto et al.; "Model-Based PPC Verification Methodology With Two-Dimensional Pattern Feature Extraction"; Proc. SPIE, Optical Microlithography XVI, vol. 5040, pp. 1156-1165, (2003).

(Continued)

*Primary Examiner*—Paul Dinh
*Assistant Examiner*—Suchin Parihar
(74) *Attorney, Agent, or Firm*—Finnegan, Henderson, Farabow, Garrett & Dunner, L.L.P.

(57) ABSTRACT

A first generator section generates a tolerance data corresponding to a target pattern set based on a design data of a semiconductor device. A second generator section generates an image data of a semi-conductor device pattern formed based on the target pattern. An extraction section extracts a contour data of the pattern from the image data supplied from the second generator section. A data synthesizing section is supplied with the tolerance data supplied from the second generator section and the contour data supplied from the extraction section. The data synthesizing section overlaps the tolerance data with the contour data.

15 Claims, 8 Drawing Sheets

U.S. PATENT DOCUMENTS

| | | | |
|---|---|---|---|
| 2004/0131246 | A1 | 7/2004 | Ikeda et al. |
| 2004/0181361 | A1 | 9/2004 | Ikeda et al. |
| 2005/0024361 | A1 | 2/2005 | Ikeda et al. |
| 2005/0183055 | A1* | 8/2005 | Herrera ................ 716/17 |
| 2006/0183035 | A1* | 8/2006 | Misaka ................ 430/5 |

FOREIGN PATENT DOCUMENTS

| | | |
|---|---|---|
| JP | 10-202477 | 8/1998 |
| JP | 11-344319 | 12/1999 |
| JP | 2000-182921 | 6/2000 |
| JP | 2002-31525 | 1/2002 |
| JP | 2002-93875 | 3/2002 |

OTHER PUBLICATIONS

Notification of Reasons for Rejection issued by the Japanese Patent Office on Jan. 9, 2007, for Japanese Patent Application No. 2003-334106, and English-language translation thereof.

* cited by examiner

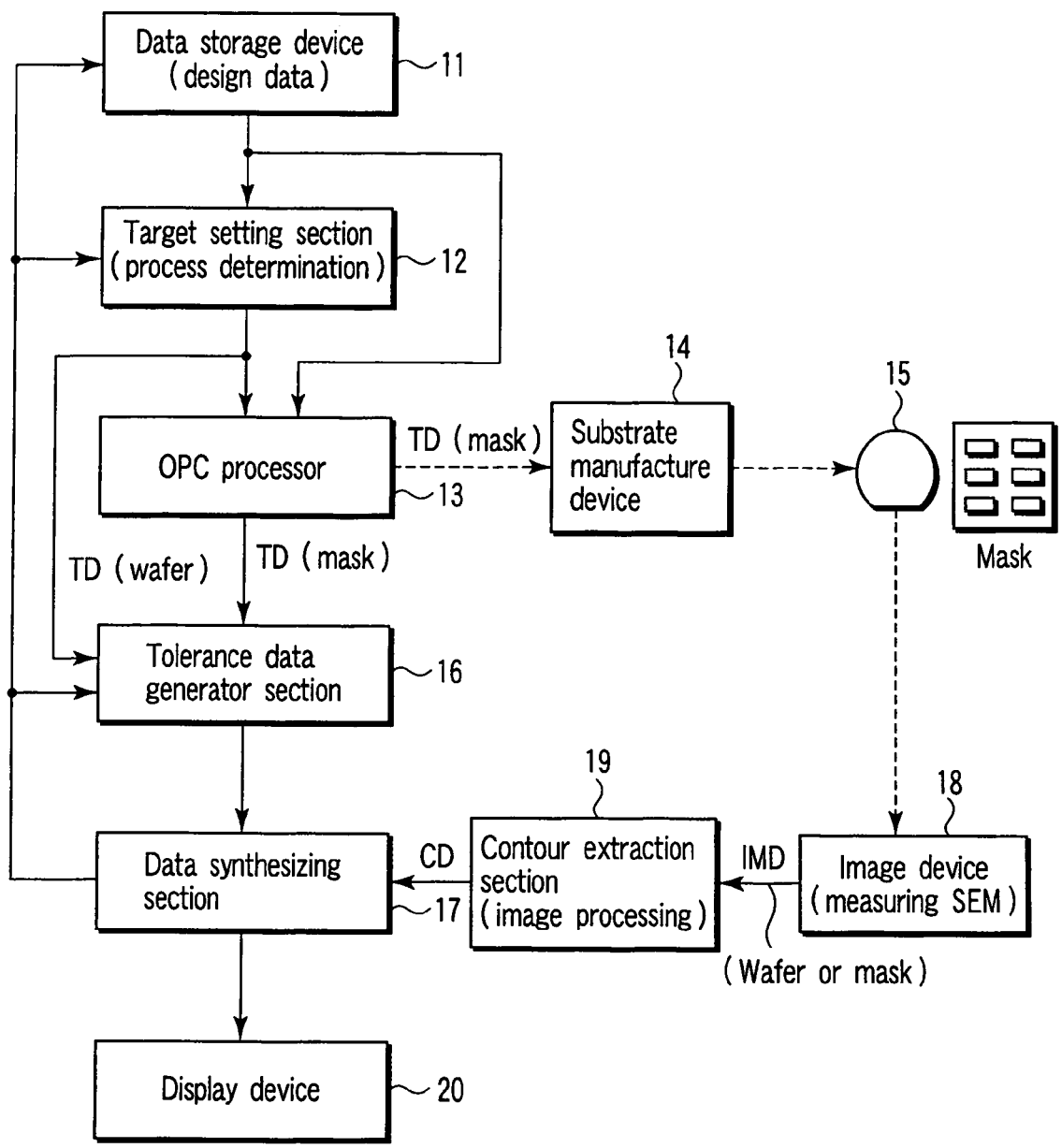
F I G. 1

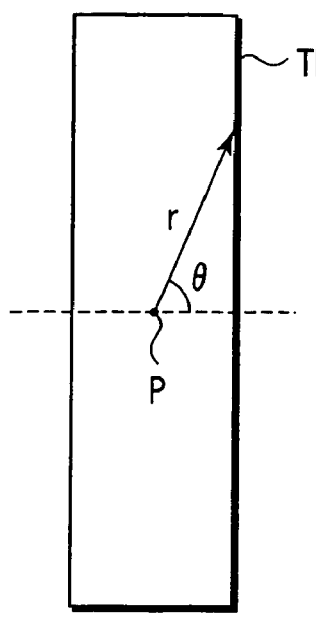
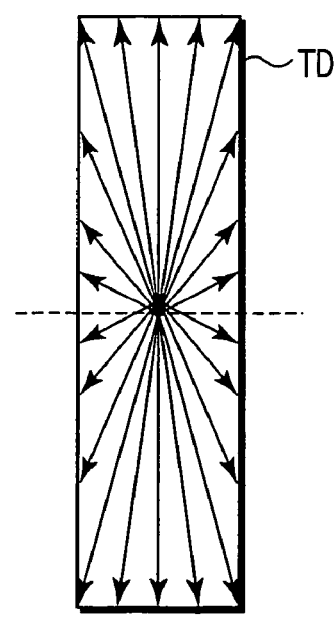
F I G. 6A  F I G. 6B
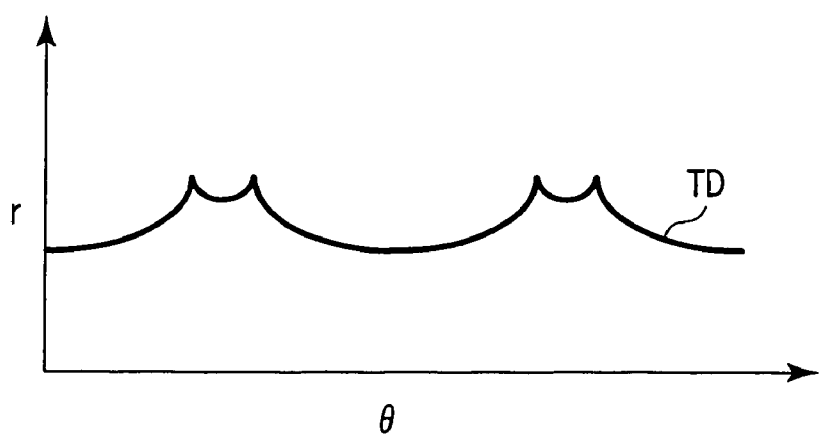
F I G. 7

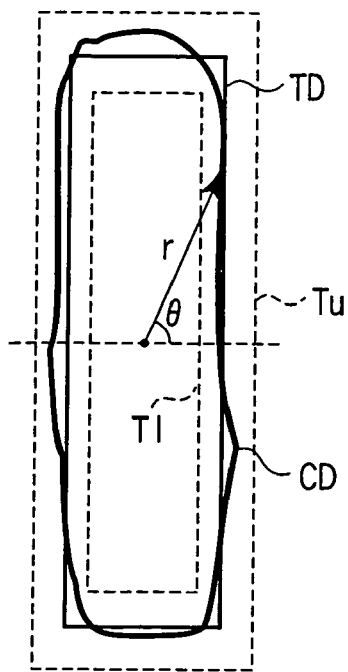 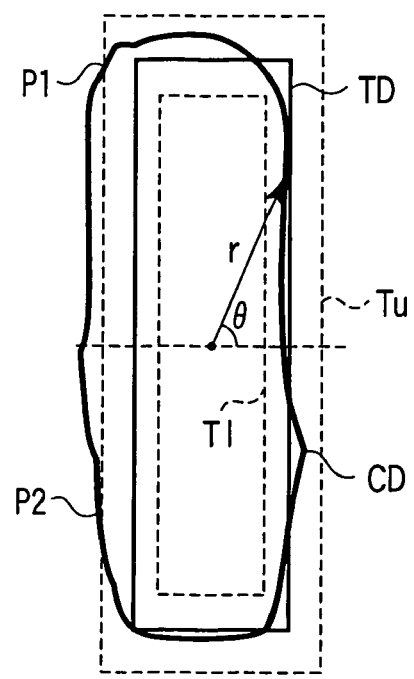
FIG. 8A   FIG. 8B
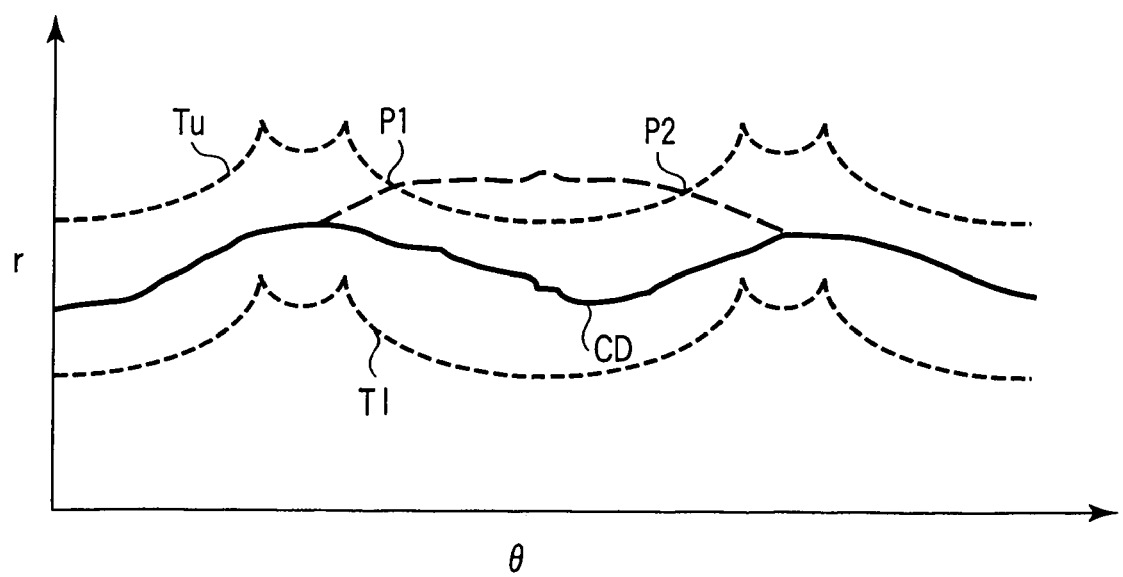
FIG. 9

APPARATUS AND METHOD FOR VERIFYING AN INTEGRATED CIRCUIT PATTERN

CROSS-REFERENCE TO RELATED APPLICATIONS

This application is based upon and claims the benefit of priority from prior Japanese Patent Application No. 2003-334106, filed Sep. 25, 2003, the entire contents of which are incorporated herein by reference.

BACKGROUND OF THE INVENTION

1. Field of the Invention

The present invention relates to apparatus and method for verifying an integrated circuit pattern formed on a substrate.

2. Description of the Related Art

In the manufacture of semiconductor devices, there is a need of verifying whether an integrated circuit pattern formed on a substrate is formed as designed in individual processes.

FIG. 15 is a view to explain a method of verifying a hole pattern. According to the method, a target data TD of preset hole pattern is overlapped with a contour data CD extracted from hole pattern formed on a substrate. In the overlapped state, distances from several places of the foregoing two patterns are measured. It is determined whether or not the difference between the measured distances is within a predetermined allowable value, and thereby, it is determined whether the formed pattern is non-defective or defective.

The method of evaluating a pattern shape has been proposed (for example, JPN. PAT. APPLN. KOKAI Publication No. 2002-31525). According to the method, the distance between CAD (Computer Aided Design) output data and pattern data measured by SEM (Scanning Electron Microscope) is measured in the same manner as described above. Based on the measured distance, evaluation is made with respect to the pattern shape.

The method of evaluating a pattern defect information has been proposed (for example, JPN. PAT. APPLN. KOKAI Publication No. 2002-93875). According to the method, the error dimension between CAD output data and shape simulation output data is measured. If the measured error dimension is not within a predetermined value, pattern defect information is displayed.

In addition, the following method has been proposed (for example, JPN. PAT. APPLN. KOKAI Publication No. 2000-182912). According to the method, comparison is made between an inspection reference pattern formed based on the design layout pattern and the finished predictive pattern. By doing so, pattern distortion of the finished predictive pattern is detected, and thereafter, the detected pattern distortion is identified in accordance with criticality.

According to the method of measuring the distance between the foregoing two patterns, a great many of places is measured, and thereby, the measurement accuracy is improved. However, if the measured places are too many, long time is spent for measuring these places. According to the method, the difference from the corner of the pattern is not so taken into consideration. For this reason, when verifying a pattern having a complicated shape, it is very difficult to determine whether the pattern is non-defective or defective. Moreover, there exist various patterns requiring to bridge neighboring patterns depending on pattern, or to control only line width of the shorter side of the pattern. In the foregoing patterns, the allowable (variable) range for the target dimension has not been clarified. For this reason, according to the conventional method, it is determined that patterns formed with accuracy having no problem on the device operation are defective.

According to the conventional method, time is taken to verify the pattern, and the features of the pattern are not considered; as a result, the pattern is not properly verified. In addition, according to the conventional method, it is difficult to evaluate a complicated pattern.

BRIEF SUMMARY OF THE INVENTION

According to a first aspect of the invention, there is provided an apparatus for verifying an integrated circuit pattern comprising: a first generator section generating a tolerance data corresponding to a target pattern set based on a design data of a semiconductor device; a second generator section generating an image data of a semiconductor device pattern formed based on the target pattern; an extraction section extracting a contour data of the pattern from the image data supplied from the second generator section; and a data synthesizing section supplied with the tolerance data supplied from the second generator section and the contour data supplied from the extraction section, and overlapping the tolerance data with the contour data.

According to a second aspect of the invention, there is provided a method of verifying an integrated circuit pattern comprising: generating an image data of a pattern formed on a substrate according to a predetermined process; extracting a contour data of the pattern from the generated image data; and determining whether or not a crossover between a tolerance data generated based on a target pattern in the process and the extracted contour data corresponding to the tolerance data exists.

According to a third aspect of the invention, there is provided a method of manufacturing a semiconductor device, comprising: generating an image data of a pattern formed on a substrate according to a predetermined process; extracting a contour data of the pattern from the generated image data; determining whether or not a crossover between a tolerance data generated based on a target pattern in the process and the extracted contour data corresponding to the tolerance data exists; and outputting at least instruction to modify the each process or to modify the tolerance data when the crossover between the tolerance data and the contour data exists as the result of the determination.

BRIEF DESCRIPTION OF THE SEVERAL VIEWS OF THE DRAWING

FIG. 1 is a block diagram showing the configuration of an apparatus for verifying an integrated circuit pattern according to one embodiment;

FIG. 6A and FIG. 6B are plan views to explain transformation from pattern data to polar coordinates data;

FIG. 7 is a graph showing polar coordinates data corresponding to the pattern data shown in FIGS. 6A and 6B;

FIG. 8A and FIG. 8B are views to explain crossover determination;

FIG. 9 is a graph showing polar coordinates data corresponding to the pattern data shown in FIG. 8A and FIG. 8B;

DETAILED DESCRIPTION OF THE INVENTION

Embodiments of the present invention will be described below with reference to the accompanying drawings.

FIG. 1 shows the configuration of an apparatus for verifying an integrated circuit pattern according to one embodiment. In order to verify whether an integrated circuit pattern is formed as designed, the apparatus verifies the pattern based on a plane image using a shape measuring technique.

A data storage device 11 is stored with design data of an integrated circuit designed using CAD. The design data read from the data storage device 11 is supplied to a target setting section 12. The target setting section 12 determines individual processes for realizing an integrated circuit pattern on a substrate based on the design data. Further, the target setting section 12 determines target and optical proximity correction (hereinafter, referred to as OPC) parameter in each process. Individual processes include processing such as lithography and etching. For example, when determining a target in the lithography step, the target setting section 12 determines a target resist pattern dimension after lithography from the preset processing conversion difference. In this case, the processing conversion difference is a difference between the dimension of resist pattern formed using the lithography and the dimension of pattern formed using the resist pattern.

Figure 2A:
FIG. 2A is a plan view showing one example of a resist pattern.
Figure 2B:
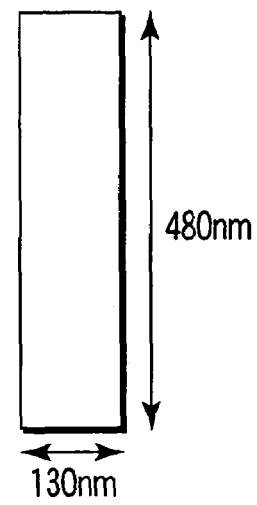
FIG. 2B is a plan view showing a target after lithography corresponding to the resist pattern shown in FIG. 2A.

As shown in FIG. 2A and FIG. 2B, a processing condition is given so that the conversion difference of 10 nm occurs in one edge of the resist pattern. The target after lithography with respect to the resist pattern shown in FIG. 2A has a shape shown in FIG. 2B. In this manner, a target is set in each process. The OPC parameter is determined based on pattern density, line width and space between lines. The target data and OPC parameter set in each process are supplied to an OPC processor 13 shown in FIG. 1. A target data TD is supplied to a tolerance data generator section 16.

The OPC processor 13 corrects the determined target data according to the determined OPC parameter and design data. Based on the corrected mask target data TD, a mask (not shown) is formed. The corrected target data TD is supplied to the tolerance data generator section 16.

The tolerance data generator section 16 generates a tolerance data in accordance with the target data TD supplied from the target setting section 12 and the mask target data TD supplied from the OPC processor 13. In other words, the tolerance data generator section 16 generates a tolerance data corresponding to the target in lithography or etching step in accordance with the target data TD supplied from the target setting section 12. Further, the tolerance data generator section 16 generates a tolerance data corresponding to the mask pattern target in accordance with the mask target data TD supplied from the OPC processor 13.

Figure 3:
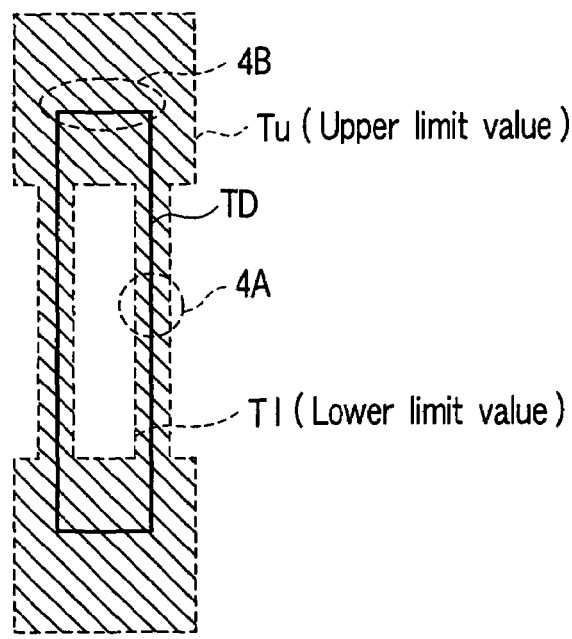
FIG. 3 is a plan view to explain a tolerance preset in the resist pattern.

FIG. 3 shows one example of the tolerance data set in a resist pattern. An allowable variable range is set with respect to a resist pattern shown by the target data TD. The allowable variable range means an allowable value in dimension and shape with respect to process variations, and has upper limit value Tu and lower limit value Tl. The process variations are drift of exposure and focus in the lithography process, aberration of lens and OPC accuracy while being drift of processing condition in the etching process. As seen from FIG. 3, a pattern having the upper limit value Tu and a pattern having the lower limit value Tl are prepared. Slanted portions between these patterns having upper and lower limit values Tu and Tl are the foregoing allowable variable range. The allowable variable range is different depending on the shape of pattern and the distance between neighboring patterns.

Figure 4A:
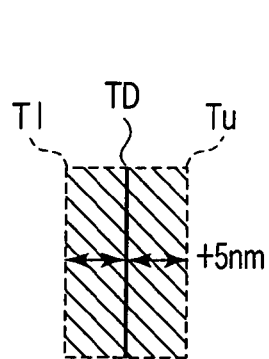
FIG. 4A and FIG. 4B are each enlarged plan views of regions 4A and 4B shown in FIG. 3.
Figure 4B:
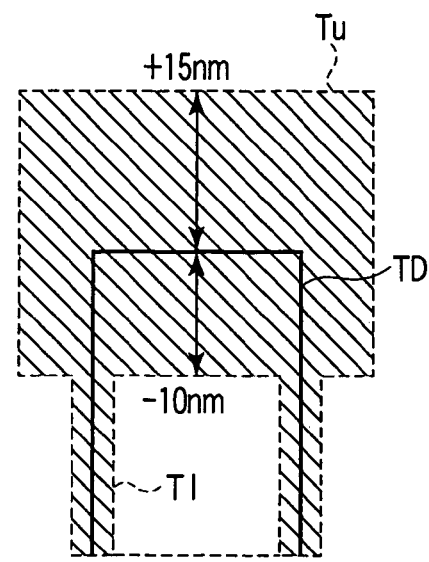

A region shown by 4A of FIG. 3, that is, a region requiring high dimensional accuracy has a narrow allowable variable range. On the other hand, a region shown by 4B of FIG. 3, that is, a region, which does not require high dimensional accuracy has a wide allowable variable range. FIG. 4A is an enlarged view of the region shown by 4A of FIG. 3, and FIG. 4B is an enlarged view of the region shown by 4B of FIG. 3. The tolerance data thus generated is supplied to a data synthesizing section 17.

On the other hand, the mask target data TD outputted from the OPC processor 13 is supplied to a substrate manufacture device 14. The substrate manufacture device 14 comprises a known device, which carries out lithography and etching steps. In order to realize the resist target shown in FIG. 2B, the substrate manufacture device 14 forms a pattern on a substrate using a mask, which is subjected to OPC. Besides, the substrate manufacture device 14 forms various patterns on the substrate in accordance with individual processes.

An imaging device 18 comprising a measuring SEM (Scanning Electron Microscope) images a desired pattern image from the surface of a substrate 15 manufactured by the substrate manufacture device 14. Image data IMD outputted from the imaging device 18 is supplied to a contour extraction section 19. The contour extraction section 19 extracts contour data of the desired pattern from the supplied image data IMD. The extracted contour data CD is supplied to the data synthesizing section 17. The data synthesizing section 17 evaluates the pattern using the contour data CD and the tolerance data.

Figure 5A:
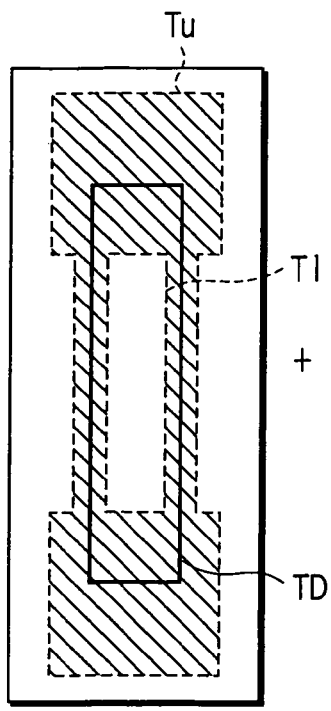
FIG. 5A to FIG. 5C are views to explain crossover determination.
Figure 5B:
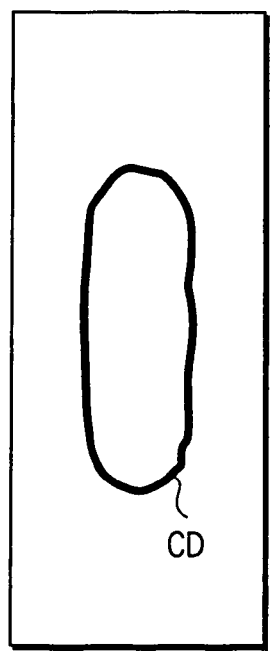
Figure 5C:
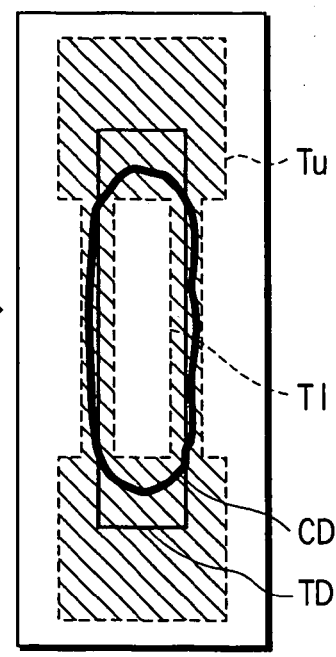

More specifically, FIG. 5A and FIG. 5B are overlapped with each other as shown in FIG. 5C. That is, the target data TD having tolerance data upper and lower limit values Tu and Tl and the contour data CD extracted from the pattern data on the substrate are overlapped with each other. Then, it is determined whether the contour data CD is within the allowable variable range. In other words, it is determined whether the contour data CD crosses over the upper or lower limit value Tu or Tl of the allowable variable range. The planar shape of the pattern is confirmed, and thereby, it is determined whether the pattern is formed on the substrate as designed.

FIGS. 6A and 6B to FIG. 9 show one example of crossover determination. The data synthesizing section 17 converts the tolerance data upper and lower limit values Tu, Tl and the contour data CD into polar coordinate data. Thereafter, crossover is determined using the polar coordinate data.

FIG. 6A, FIG. 6B and FIG. 7 show the case where the target data TD is converted into polar coordinate data. As shown in FIG. 6A and FIG. 6B, distances r from one arbitrary point P in the target data TD to some points of the target data are measured. In this case, measurement is made having an angle of θ. FIG. 7 shows the example of representing the target data TD by the polar coordinate. Likewise, the tolerance data upper and lower limit values Tu, Tl and the contour data CD are represented by the polar coordinate. Thereafter, comparison is made with respect to these data, and thereby, crossover determination is made.

FIG. 8A shows a state that the contour data CD is within the range of the upper and lower limit values Tu and Tl. In this case, as shown by the solid line in FIG. 9, the contour data CD represented by the polar coordinate is positioned between the upper and lower limit values Tu and Tl represented by the polar coordinate. Thus, the contour data CD does not cross over the upper and lower limit values Tu and Tl.

On the other hand, FIG. 8B shows the case where part of the contour data CD crosses over the upper limit value Tu. In this case, as shown by the broken line in FIG. 9, the value of the contour data CD becomes larger than the upper limit value Tu in a range from a point P1 to P2. In other words, the contour data CD crosses over the upper limit value Tu.

The data synthesizing section 17 makes a comparison with respect to the contour data CD, upper and lower limit values Tu and Tl, which are converted into the polar coordinate data. More specifically, the distances of the contour data CD, upper and lower limit values Tu and Tl are compared for each angle θ. It is determined whether or not the distance of the contour data CD is the same as the distance of the upper and lower limit values Tu and Tl. By doing so, it is determined whether or not a crossover portion exists. The determination is made; as a result, if it is determined that the pattern is not formed as designed, the data synthesizing section 17 takes the procedure given below. The data synthesizing section 17 selects a section requiring data feedback based on OPC data change, process change, target reset, tolerance data reset, pattern design change and mask corrections, and then, gives the foregoing instructions to the selected section. In the embodiment, if it is confirmed that crossover exists based on the crossover determination, a resist process change is made. By doing so, the pattern formed on the substrate is set within the allowable variable range. The determination result is supplied to a display device 20, and then, displayed thereon.

Incidentally, the apparatus shown in FIG. 1 includes the substrate manufacture device 14; in this case, the substrate manufacture device 14 may be provided independently of the apparatus.

Figure 10:
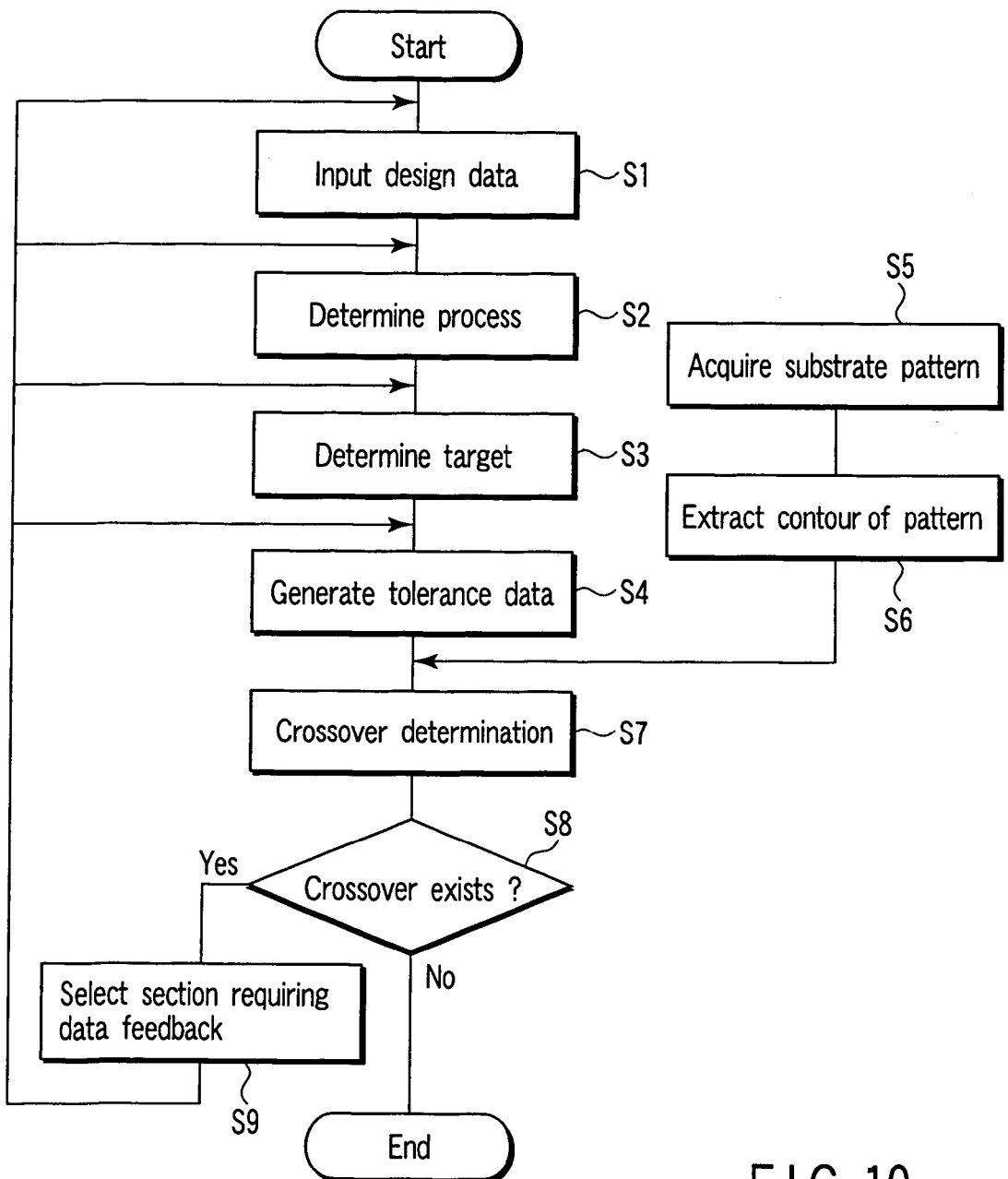
FIG. 10 is a flowchart to explain the verification operation of the apparatus shown in FIG. 1.

The method of verifying an integrated circuit pattern using the apparatus shown in FIG. 1 will be described below with reference to FIG. 10. The design data is read from the data storage device 11 (S1). The target setting section 12 determines processes such as lithography and etching from the design data (S2). A target of each process and OPC parameters are determined (S3). The tolerance data generator section 16 generates tolerance data including upper and lower limit values Tu and Tl from the determined target of each process (S4).

On the other hand, the imaging device 18 images a pattern formed on the substrate using a mask, which is subjected to OPC by the OPC processor 13 (S6). The contour extraction section 19 extracts contour data of the pattern from the image data outputted from the imaging device 18 (S6). The extracted contour data is supplied to the data synthesizing section 17 together with the tolerance data generated by the tolerance data generator section 16. The data synthesizing section 17 compares the contour data with the tolerance data upper and lower limit values Tu and Tl to determine whether or not the crossover portion exists (S7 and S8). The determination is made; as a result, if the crossover portion exists, the data synthesizing section 17 takes the procedure given below (S9). More specifically, the data synthesizing section 17 selects a section requiring data feedback based on OPC data change, process change, target reset, tolerance data reset, pattern design change and mask corrections, and then, gives the foregoing instructions to the selected section. As described before, if the resist pattern is set as target, a resist process change is made, and thereby, the pattern formed on the substrate is set within the allowable variable range.

When the verifies a mask pattern, the tolerance data generator section 16 generates the upper and lower limit values Tu and Tl in accordance with the target data supplied from the OPC processor 13. The data synthesizing section 17 compares the contour data extracted from the mask pattern with the upper and lower limit values Tu and Tl to determine whether or not the crossover portion exists. By doing so, it is evaluated whether the mask pattern is non-defective or defective.

FIG. 11A to FIG. 14 show modification examples of the tolerance data. FIG. 2 to FIG. 4 show the example of generating tolerance data with respect to one target pattern (target data). The quality of a pattern applied to an integrated circuit changes depending on the distance between adjoined wiring patterns and on a contact pattern connected to the wiring pattern. Therefore, the method of generating tolerance data with respect to various patterns will be explained below.

Figures 11A, 11B:
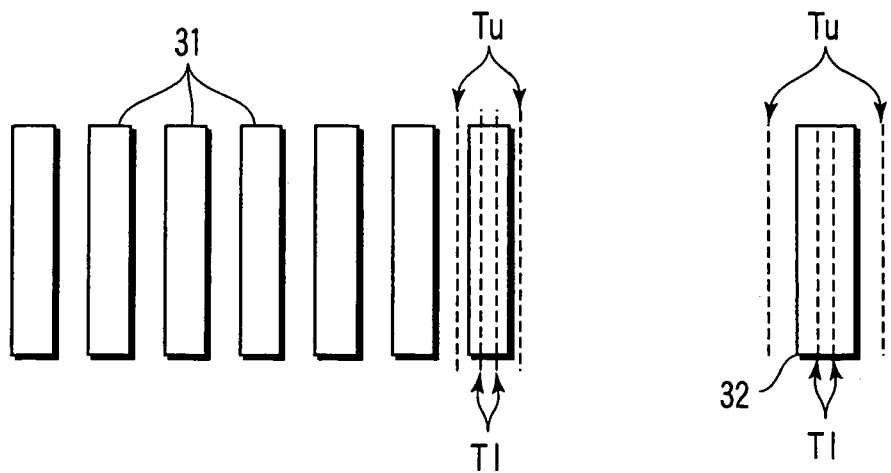
FIG. 11A and FIG. 11B are a plan view showing a modification example of crossover data.

FIG. 11A shows a gate wiring pattern 31 in a memory cell array, and FIG. 11B shows a wiring pattern 32 formed on peripheral circuits. If the width of the wiring pattern changes in the memory cell array shown in FIG. 11A, this gives a very large influence to device characteristics such as device operation speed and threshold value. For this reason, the pattern of the region requiring high dimensional accuracy like the memory cell array must be narrowed in its width. That is, the upper and lower limit values Tu and Tl defining the allowable variable range must be reduced.

On the contrary, influence giving to device characteristics is small in the wiring pattern 32 shown in FIG. 11B formed on peripheral circuits. Therefore, the upper and lower limit values Tu and Tl defining the allowable variable range are taken widely. Thus, the allowable variable range is set to various ranges in accordance with the device characteristics.

Figure 12:
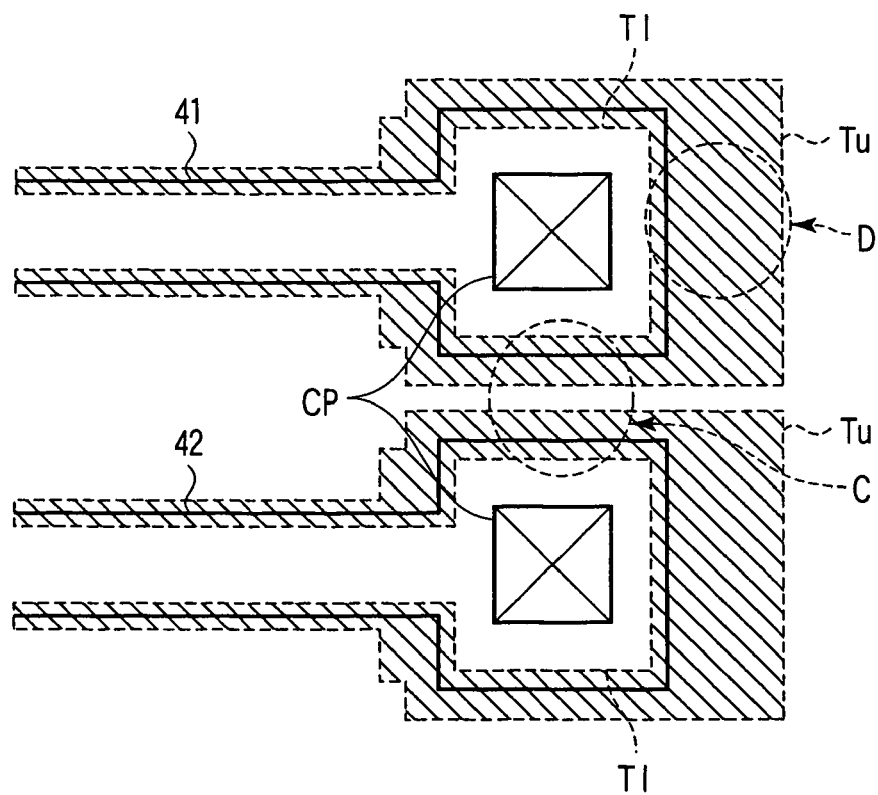
FIG. 12 is a plan view showing another modification example of crossover data.

FIG. 12 shows the case where fringe patterns 41 and 42 having one end connected with contact hole (contact pattern CP) are arrayed adjacent to each other. If the allowable variable range is set in the foregoing fringe patterns 41 and 42, it should be set taking the following matter into consideration. More specifically, a region shown by the arrow C has a narrow interval between the patterns 41 and 42. In this case, there is a possibility that adjoined patterns 41 and 42 short-circuit. Thus, the region requires high dimensional accuracy; for this reason, the allowable variable range defined by the upper and lower limit values Tu and Tl must be set narrow.

On the contrary, a region shown by the arrow D in the direction perpendicular to the arrayed direction of the patterns 41 and 42 has no neighboring pattern. In this case, the possibility of short-circuiting another pattern is low. Therefore, in the region, the allowable variable range defined by the upper and lower limit values Tu and Tl can be set wide. As described above, the allowable variable range is set to various ranges in accordance with the arrayed state of the pattern.

Figure 13:
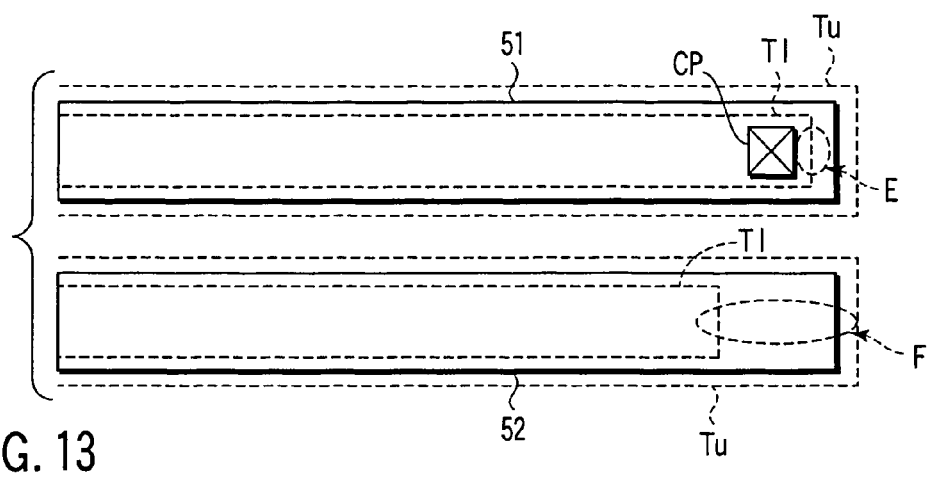
FIG. 13 is a plan view showing another modification example of crossover data.

FIG. 13 shows the case where wiring patterns 51 and 52 are arrayed adjacent to each other, and the wiring pattern 51 is formed with a contact hole (contact pattern PC) via the upper layer. The wiring pattern 51 connected with the contact pattern CP must prevent misalignment with the contact pattern CP. For this reason, the allowable variable range defined by the lower limit value Tl must be narrowed in a region shown by the arrow E, that is, in a region from one end of the pattern 51 in the length direction to one side of the contact pattern CP.

On the contrary, the wiring pattern 52 connected with no contact pattern has no need of considering the misalignment with the contact pattern in a region shown by the arrow F. Therefore, the allowable variable range defined by the lower limit value Tl can be set widely.

Figure 14:
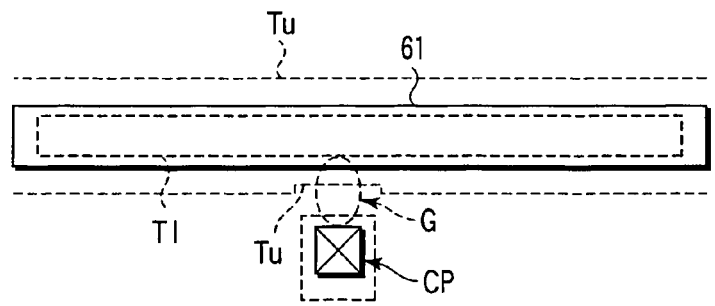
FIG. 14 is a plan view showing another modification example of crossover data.
Figure 15:
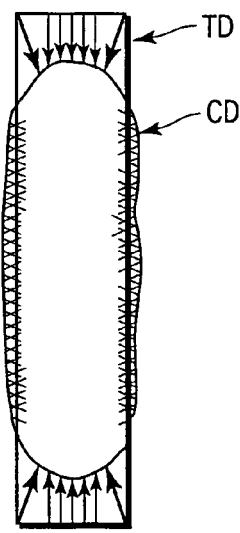
FIG. 15 is a plan view to explain a conventional method of verifying a pattern.

FIG. 14 shows the case where with a contact hole is formed in the vicinity of an wiring pattern 61 via the upper layer. In this case, it is difficult to make alignment of the wiring pattern 61 with the contact pattern CP. For this reason, a region shown by the arrow G has a possibility that the wiring pattern 61 and the contact pattern CP short-circuit. Therefore, in the region G, the allowable variable range defined by the upper limit value Tu is set narrow. On the other hand, in regions other than the region G, the allowable variable range defined by the upper limit value Tu is set widely. As described above, the allowable variable range is set to various ranges in accordance with the positional relationship between upper and lower layer patterns.

Incidentally, the foregoing process includes the following steps at least: a step of forming an exposure mask; a step of transferring a resist pattern on the substrate using the exposure mask; and a step of processing the resist pattern formed on the substrate.

The following patterns are verification objects.

(1) Pattern subjected to OPC. This is because it is necessary to verify whether OPC is properly made.

(2) Pattern extracted from photolithography simulation, and having a large change in its dimension and shape resulting from process change. The pattern has a large dimensional change if process change factors such as lithography exposure, focus and aberration of lens change. In other words, the pattern is extracted as a pattern having small lithography margin.

(3) Pattern existing on a region changing or modifying circuit pattern. This is because it is necessary to verify whether the change is properly reflected.

According to the embodiment, the tolerance data is set as the allowable variable range in accordance with various targets. It is determined whether or not the crossover of the tolerance data and the contour data extracted from the pattern formed on the substrate exists. By doing so, the pattern formed on the substrate is verified. Therefore, it is possible to readily determine whether or not the pattern having a complicated shape is properly formed, although it is conventionally difficult to evaluate the pattern by using only dimensional measurement.

The tolerance data has upper and lower limit values in accordance with the following conditions. The width of the target pattern, the area thereof, the distance from the corner thereof and the distance between adjoined patterns are given as the condition. In addition, one of the conditions is the distance from the periphery of the contact pattern to the periphery of the wiring pattern when the wiring pattern is connected with the contact pattern. Another is the distance between the wiring pattern and the contact pattern when the contact pattern is formed adjacent to the wiring pattern. Thus, the tolerance data is used, and thereby, it is possible to verify the pattern more properly than the conventional case.

The tolerance data is properly set with respect to the target pattern, and thereby, there is no need of taking a wider margin than the necessity between patterns. Therefore, the scale-down of device can be achieved.

The data synthesizing section 17 converts the contour data CD, upper and lower limit values Tu and Tl into the polar coordinate data. Then, the data synthesizing section 17 detects the crossover between the converted contour data CD and the upper and lower limit values Tu and Tl into polar coordinate data. By doing so, it is determined whether the pattern is non-defective or defective. Therefore, it is possible to shorten time spent for determination as compare with the conventional measuring method.

The contour data CD, upper and lower limit values Tu and Tl are converted into the polar coordinate data, and thereby, the contour data CD and the tolerance data pattern shape are accurately grasped. Therefore, it is possible to accurately verify a complicated pattern shape and device characteristics.

In the embodiment, the data synthesizing section 17 overlaps the upper and lower limit values Tu and Tl of the tolerance data with the contour data CD extracted from the pattern image on the substrate. Then, the data synthesizing section 17 determines whether or not the contour data CD is set within the allowable variable range. The present invention is not limited to the embodiment; in this case, the crossover determination may be visually made. More specifically, the data synthesizing section 17 simply overlaps the upper and lower limit values Tu and Tl of the tolerance data with the contour data CD extracted from the pattern image on the substrate. Thereafter, the overlapped data is displayed on the display device 20, and then, it is possible to visually determine the data displayed thereon.

The target setting section 12 is provided with a simulator, and the simulator simulates various processes based on the design data supplied from the data storage device 11. The data generated by the simulations may be set as target pattern data (target data). In this case, the tolerance data generator section 16 generates tolerance data in accordance with the target data generated by the simulations. The data synthesizing section 17 synthesizes the crossover data supplied from the tolerance data generator section 16 and the target data generated by simulations supplied from the target setting section 12. Then, the data synthesizing section 17 determines whether or not the crossover exists. The determination result of the data synthesizing section 17 is fed back to the target setting section 12. The target setting section 12 changes the simulation data of each process and OPC parameters based on the fed-back determination result.

The apparatus has the configuration described above, and thereby, it is possible to improve simulation accuracy, and to properly set OPC parameters.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. An apparatus for verifying an integrated circuit pattern comprising:
    a first generator section generating tolerance data corresponding to a target pattern set based on design data of a semiconductor device;
    a second generator section generating image data of a semiconductor device pattern formed based on the target pattern, wherein the second generator section generates the image data by imaging the semiconductor device pattern;
    an extraction section extracting contour data of the semiconductor device pattern from the image data supplied from the second generator section; and a data synthesizing section supplied with the tolerance data supplied from the first generator section and the contour data supplied from the extraction section, and overlapping the tolerance data with the contour data, wherein the data synthesizing section determines whether or not a crossover between the overlapped tolerance date and contour data exists, and further wherein the data synthesizing section converts the overlapped tolerance data and the contour data into a polar coordinate data, wherein the tolerance data has upper and lower limit values corresponding to one of a distance from at least one side of a contact pattern to one side of a wiring pattern parallel to said one side when the wiring pattern is connected with the contact pattern, and a distance between the wiring pattern and the contact pattern when the contact pattern is formed adjacent to the wiring pattern.

2. The apparatus according to claim 1, wherein the data synthesizing section outputs at least instruction to modify the design data, target reset or instruction to modify the tolerance data when the crossover between the tolerance data and the contour data exists.

3. The apparatus according to claim 1, wherein the target pattern is a pattern generated by simulation.

4. The apparatus according to claim 1, wherein the tolerance data has upper and lower limit values corresponding to one of a target pattern width, a target pattern area, a distance from the corner of the target pattern thereof, a distance between adjoined patterns and a positional relationship between upper- and lower-layer patterns.

5. The apparatus according to claim 1, further comprising:
a process determination section determining a process for forming a pattern on a substrate based on the design data.

6. The apparatus according to claim 5, wherein the process determination section determines optical proximity correction parameters in the process.

7. The apparatus according to claim 6, further comprising:
a correction section correcting the target pattern based on the optical proximity correction parameters supplied from the process determination section and the design data.

8. A method of verifying an integrated circuit pattern comprising:
generating image data of a pattern formed on a substrate according to a predetermined process by imaging the pattern;
extracting contour data of the pattern from the generated image data; and
determining whether or not a crossover between tolerance data generated based on a target pattern in the process and the extracted contour data corresponding to the tolerance data exists, wherein the tolerance data and the contour data are converted into polar coordinate data,
wherein the tolerance data has upper and lower limit values corresponding to one of a distance from at least one side of a contact pattern to one side of a wiring pattern parallel to said one side when the wiring pattern is connected with the contact pattern, and a distance between the wiring pattern and the contact pattern when the contact pattern is formed adjacent to the wiring pattern.

9. The method according to claim 8, wherein the process includes:
preparing an exposure mask;
transferring a resist pattern on the substrate using the exposure mask; and
processing the resist pattern formed on the substrate.

10. The method according to claim 8, wherein the tolerance data has upper and lower limit values corresponding to one of a target pattern width, a target pattern area, a distance from the corner of the target pattern thereof, a distance between neighboring patterns and a positional relationship between upper- and lower-layer patterns.

11. The method according to claim 8, wherein the verification object pattern formed on the substrate is a pattern, which is subjected to optical proximity correction.

12. The method according to claim 8, wherein the verification object pattern formed on the substrate is a pattern, which is extracted according to photolithography simulation.

13. The method according to claim 8, wherein when the crossover between the tolerance data and the contour data exists as the result of the determination, at least instruction to modify said each process or to modify the tolerance data is outputted.

14. A method of manufacturing a semiconductor device, comprising:
generating image data of a pattern formed on a substrate according to a predetermined process by imaging the pattern;
extracting contour data of the pattern from the generated image data;
determining whether or not a crossover between tolerance data generated based on a target pattern in the process and the extracted contour data corresponding to the tolerance data exists, wherein the tolerance data and the contour data are converted into polar coordinate data; and
outputting at least one instruction to modify said process or to modify the tolerance data when the crossover between the tolerance data and the contour data exists as the result of the determination,
wherein the tolerance data has upper and lower limit values corresponding to one of a distance from at least one side of a contact pattern to one side of a wiring pattern parallel to said one side when the wiring pattern is connected with the contact pattern, and a distance between the wiring pattern and the contact pattern when the contact pattern is formed adjacent to the wiring pattern.

15. The method according to claim 14, wherein the tolerance data has upper and lower limit values corresponding to one of a target pattern width, a target pattern area, a distance from the corner of the target pattern thereof, a distance between neighboring patterns and a positional relationship between upper- and lower-layer patterns.

* * * * *